(12) United States Patent  
Dutta

(10) Patent No.: US 8,019,187 B1  
(45) Date of Patent: Sep. 13, 2011

(54) SUPER HIGH-SPEED CHIP TO CHIP INTERCONNECTS

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

(21) Appl. No.: 12/542,492

(22) Filed: Aug. 17, 2009

(51) Int. Cl.
*G02B 6/12* (2006.01)

(52) U.S. Cl. .......................................... 385/14; 385/133

(58) Field of Classification Search .................. None
See application file for complete search history.

(56) References Cited

U.S. PATENT DOCUMENTS

| | | | | |
|---|---|---|---|---|
| 6,736,552 | B2 * | 5/2004 | Martwick | 385/88 |
| 7,049,704 | B2 * | 5/2006 | Chakravorty et al. | 257/778 |
| 7,125,176 | B1 * | 10/2006 | Stafford et al. | 385/94 |
| 7,305,156 | B2 * | 12/2007 | Mohammed | 385/14 |
| 2005/0220386 | A1 * | 10/2005 | Nakada et al. | 385/1 |

* cited by examiner

*Primary Examiner* — Tina M Wong

(57) ABSTRACT

Disclosed herein is a technique for increasing bandwidth for super high speed interconnects. The invention combines an electrical signal with an optical signal to provide a bandwidth greater than is possible with each individual signal.

20 Claims, 24 Drawing Sheets

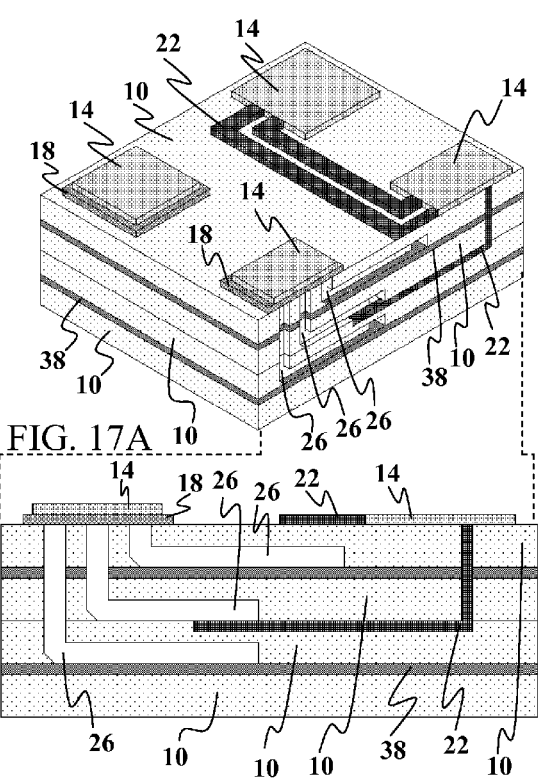
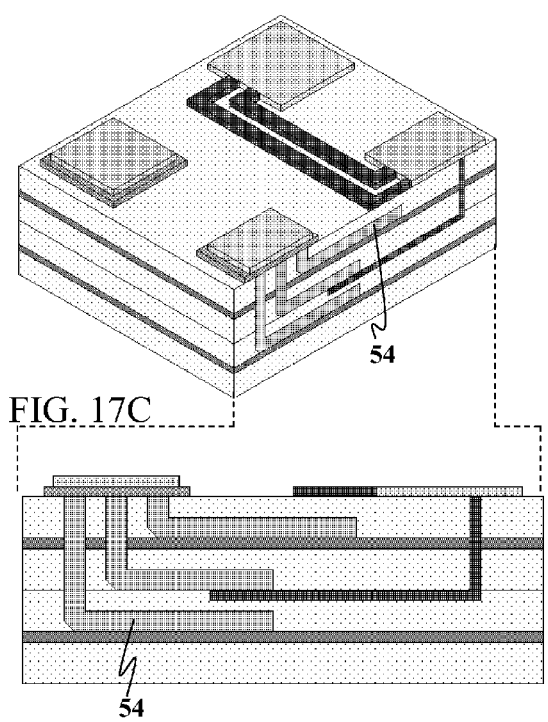
FIG. 17A    FIG. 17C
FIG. 17B    FIG. 17D

SUPER HIGH-SPEED CHIP TO CHIP INTERCONNECTS

FIELD OF THE INVENTION

This invention relates to super high speed electrical and optical interconnects or terabit interconnects for chip-to-chip interconnection, more particularly on the high-speed printed circuit board, where two or more integrated circuits (ICs) are needed to connect each other's signal lines for communicating. These types of high speed PCBs could be in all kinds of computers, for example personal computers to super-computers, servers, storage systems, gaming systems, imaging systems, and networking systems. This invention is also related to the high-speed electrical interconnection, optical interconnection or combination of both electrical and optical interconnection where PCB is used for two or more super high-speed electronics and/or optical elements connection. In addition, this invention is also relates to the on-chip interconnects where two or more electronics elements (e.g. transistors) are needed to connect for communication.

BACKGROUND OF THE INVENTION

The increasing of higher level of integration within electrical integrated circuit (IC) leads to both higher data rates and larger numbers of IC interconnections. Today, the inherent signal speed of IC has been increased to 3 GHz, and shortly it will reach 10 GHz and beyond. The number of pin connections is also increasing, with a single IC requiring close to 2000 interconnections (i.e. single processor), and shortly it will reach over 5000 interconnections. Simultaneously achieving higher data rates and higher interconnect densities for off-chip will be increasingly difficult as the IC technologies continue to evolve, increasing the signal speeds of electronic devices and the number of interconnections. In the off-chip case, high density interconnects, covering from die-level packaging to chip-to-chip (hereafter chip indicates the die with package) interconnection on the PCB, will also be getting increasingly difficult as the IC technologies continue to evolve, increasing the signal speeds and interconnection numbers.

With the increase of signal speeds and interconnection numbers of the IC, it is highly desirable to make low-cost high-speed interconnect techniques compatible with today's manufacturing processes available in consumer level. Today's PCB is mainly made of uniform FR4 material, and their manufacturing technology along with PCB manufacturing are so well matured that, for the long run, all system vendors like to use FR4 based PCB to keep the system cost low. However, FR4 has material characteristics that limit its usage in high speed if conventional interconnection structures are used. The reason is that conventional FR4 has high dielectric loss which mainly limits the bandwidth of interconnects.

In a conventional PCB, as the signal line is either laid on the dielectric material or embedded into the dielectrics, the signal experiences dissipation while propagating through the signal line, based on the dissipation factor (tangent loss) of the dielectric material used as the core layer in the PCB. The reason is that the electric field starts from the signal line and ends in the ground, and this electric field passes through the dielectric. This signal dispersion is proportional to the signal frequency, i.e. signal speed. This means that the higher the signal speed, the lower the distance of transmission of signal for the fixed dielectric material. In the other words, the higher the speed, the lower the bandwidth of the signal line which is used for connecting one chip to another chip on the board. If the tangent loss of the dielectrics are high, the bandwidth of the interconnects gets so limited that high speed signals cannot be sent over longer distances as compared with dielectrics having lower tangent loss.

In addition to tangent loss, the dielectric constant of dielectric material is also important, as an electrical field inside dielectric material having a higher dielectric constant experiences more signal delay as compared with that of a transmission line comprising lower dielectric constant material. This causes signal skews for different length signal lines. In this case also, lower dielectric constant material is necessary in the interconnection for high-speed signal interconnection. This is true for both on-chip and off-chip interconnection. Lower dielectric constant material with low dielectric loss offers the following functions: (1) higher density interconnection is possible due to reduction of the cross talk, (2) reduction of the capacitance of the interconnection, helping to transfer the signal longer distances, and (3) lower propagation delay.

Considering signal loss and signal delay for various signal line lengths, it is highly desirable to design the interconnects on PCB with lower effective dielectric constant and lower effective loss of the interconnect system.

It is very straight forward that increasing the bandwidth can be possible by the usage of material having lower loss tangent (dielectric loss). However, in this case, for off-chip interconnection new material development is necessary. Besides, manufacturing technology needs to be developed to implement at the product level. Conventionally, to increase the interconnects bandwidth, dielectrics having lower tangent loss are used as the PCB layer. This dielectric material is very high cost, and the manufacturing processes for building PCB using these materials have not matured yet. In addition, the PCB made of such low loss material has low reliability. It is highly desirable to have high speed PCB that can be built up with the conventional well-matured dielectric material (for example FR4) and also conventional well-matured fabrication processes. This can not only reduce the cost, but also have high reliability.

Much work can be found in off-chip interconnection technology focusing on material development. As for example, low loss materials like Rogers R/flex 1100, etc. are at the development stage to achieve high bandwidth. Implementing new material in PCB fabrication processes will cost tremendously to make it mature. In addition, new materials having low tangent loss are incompatible with conventional dielectric materials, such as FR4 processing, and thus is not a low cost solution. These materials will require a much higher temperature and pressure for bonding. Today, in developing the high speed PCB, more focus is on shortening the length or on the interconnection layout. In both cases, implementing technology would come at high cost.

As explained above, the conventional PCB technology being used for off-chip interconnection cannot be used as the need of the signal speed is increasing. Also, existing conventional electrical interconnects have the limitation of achieving the bandwidth in certain level, beyond which complete manufacturing technology is needed to be changed which is costly for the PCB industry. It is highly desirable to have lower dielectric constant and lower dielectric loss (loss tangent) by adopting a technique or method which can be easily implemented, and which can use the standard dielectric material PCB technology.

In addition off-chip (on PCB) interconnects, or on-chip (inside IC) are also getting very critical issues as both frequency and interconnect density are increasing. It is estimated that in today's chip, more than 50% of total on-chip's power requirement is due to interconnects related loss. Reducing the power loss in interconnects of on-chip can able to reduce significantly the IC power requirement.

SUMMARY OF THE INVENTION

It is the objective of this invention to describe a technique for increasing the signal bandwidth by combining an electrical signal with an optical signal. The resulting signal is an exponentially increased data rate per unit square area capable of achieving more than terabit per second interconnection speeds in both inter-chip (off-chip) or intra-chip (on-chip).

This technique increases the data rate throughput more than that is possible by the electrical and optical signals separately. For example combining an electrical signal of 10 Gb/s second with an optical signal of 10 Gb/s results in a combined throughput signal of 20 Gb/s, which exceeds the data rate possible by each individual signal line.

BRIEF DESCRIPTION OF THE DRAWINGS

FIGS. 7A-7D represent an embodiment of the invention having one optical tunnel and one electrical signal line, wherein FIGS. 7A and 7B are trimetric views, FIG. 7C is a top view, and FIG. 7D is a side view. FIG. 7A represents the invention as a hatched solid, with like elements have the same hatch pattern. FIGS. 7B, 7C, and 7D represent the invention with the hidden lines visible as dotted lines.

FIG. 9A shows a tunnel with a circular cross section. FIG. 9B shows a tunnel with a rectangular cross section, wherein the tunnel occupies only a portion of the thickness of the substrate layer. FIG. 9C shows a tunnel with a rectangular cross section, wherein the tunnel occupies the entire thickness of the substrate layer. FIG. 9D shows a tunnel with a trapezoidal cross section that is thinner at the top than at the bottom, wherein the tunnel occupies the entire thickness of the substrate layer. FIG. 9E shows a tunnel with a trapezoidal cross section that is thicker at the top than at the bottom, wherein the tunnel occupies the entire thickness of the substrate layer. FIG. 9F shows a tunnel with a rectangular cross section, wherein the tunnel occupies the entire thickness of the substrate layer, and wherein that substrate layer is substantially thicker than the substrate layer immediately above it.

FIGS. 10A-10D represent an embodiment of the invention having three sets of optical tunnels and two sets of electrical signal lines, wherein FIGS. 10A and 10B are trimetric views, FIG. 10C is a top view, and FIG. 10D is a side view. FIG. 10A represents the invention as a hatched solid, with like elements have the same hatch pattern. FIGS. 10B, 10C, and 10D represent the invention with the hidden lines visible as dotted lines.

FIG. 11A has open tunnels, and FIG. 11B has tunnels filled with a material that can pass through light.

FIG. 12A has open tunnels, and FIG. 12B has tunnels filled with a material that can pass through light.

FIG. 13A has open tunnels, and FIG. 13B has tunnels filled with a material that can pass through light.

FIG. 14A has open tunnels, and FIG. 14B has tunnels filled with a material that can pass through light.

FIG. 17A is identical to FIG. 10A, except that the device is cut away at a point through the electronic elements on the plane perpendicular to the electrical signal lines and optical tunnels. In this figure, the tunnels are open to air.

FIG. 17B is a cross section along the plane where the device is cut away in FIG. 17A.

FIG. 17C is identical to FIG. 17A, except that the tunnels are filled with a material that can pass through light.

FIG. 17D is a cross section along the plane where the device is cut away in FIG. 17D, and is identical to FIG. 17B except that the tunnels are filled with a material that can pass through light.

DESCRIPTION OF THE PREFERRED EMBODIMENTS

Figure 1:
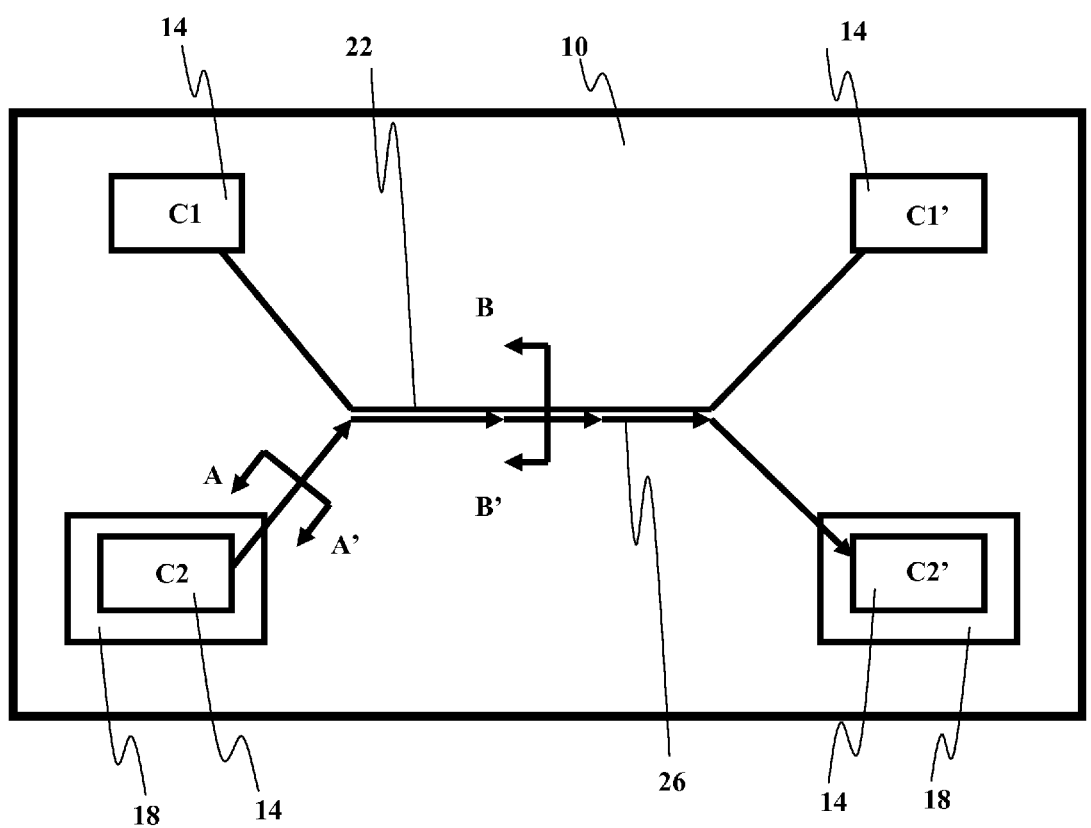
FIG. 1 is the top view of a super high-speed interconnection system on a board showing two sets of electronic elements interconnected according to the technique disclosed in the present invention.

The best modes for carrying out the present invention will be described in turn with reference to the accompanying drawings. In the following description, the same reference numerals denote components having substantially the same functions and arrangements, and duplicate explanation will be made only where necessary.

An important point of the super high-speed interconnection system for high-speed off-chip connection is the idea that an essential part, an optical-electrical board (hereafter mentioned as "O-E" and OE board) is required and it is to be compatible and easily stackable with the available chip package and also PCB. To make it cost-effective, the board should be friendly for the manufacturing as electronics components.

In off-chip interconnection, the signal between the chips is conveyed electrically through the wire and optically through the optical media. The idea is to transfer the high-speed optical signal from one chip to another after conversion into optical from electrical and vice-versa for the receiving signal. The relatively lower speed electrical signal connection and the other connections such as ground and power line connections are done through the electrical wire. When the signals are conveyed by light (i.e. optically), the optoelectronics devices provide the conversions between the light and electrical representations of the signals.

FIG. 1 is the top view of a super high-speed interconnection system on a board 10 showing two sets of electronic elements 14 and one set of optical-electrical boards (OE boards) 18 interconnected according to the technique disclosed in the present invention. The interconnection system consists of the electronic element C1 that transmits a high-speed electrical signal to electronic element C1' through an electrical signal line 22, and the electronic element C2 which transmits a high-speed optical signal to electronic element C2'. The optical signal from C2 is transmitted through an OE board on which C2 is attached. The OE board converts the high-speed intra-chip electrical signal into an optical signal or light. The optical signal is directed though a tunnel 26 in the board and received by another OE board on which C2' is attached. The receiver OE board converts the optical signal back to an electrical signal.

The exponentially increased data rate or super high-speed data rate achieved according to this invention is the combination of electrical signal transmitted on the electrical signal line and the optical signal transmitted through the tunnel and can be observed along the interconnection path labeled by the cross-sectional line BB'.

According to this invention the wavelength of the light emitted by the OE board can be selected so that the speed through the tunnel is controlled. The tunnel through which the light is transmitted can also be filled with material that pass through light and also alters the wavelength of the light.

Figure 2A:
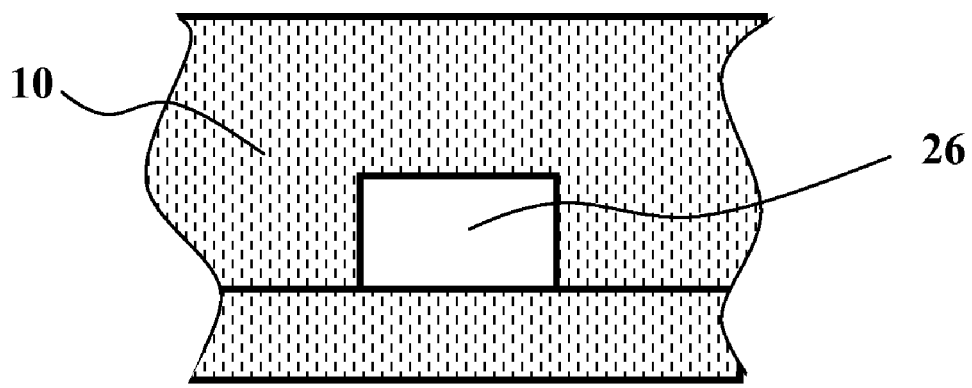
FIG. 2A is a cross-sectional view along the line AA' in FIG. 1. It consists of a substrate in which a tunnel is etched out on the backside of the substrate.

FIG. 2A is a cross-sectional view along the line AA' in FIG. 1. It consists of a substrate 10 in which a tunnel 26 is etched out on the backside of the substrate. Here, the tunnel is rectangular, but it can be a number of other different shapes. The surface of the tunnel is coated with an reflective coating, which is not shown. The tunnel shown here is not filled with a material. Alternatively, the tunnel can be filled by the material suitable to guide the optical signal.

Figure 2B:
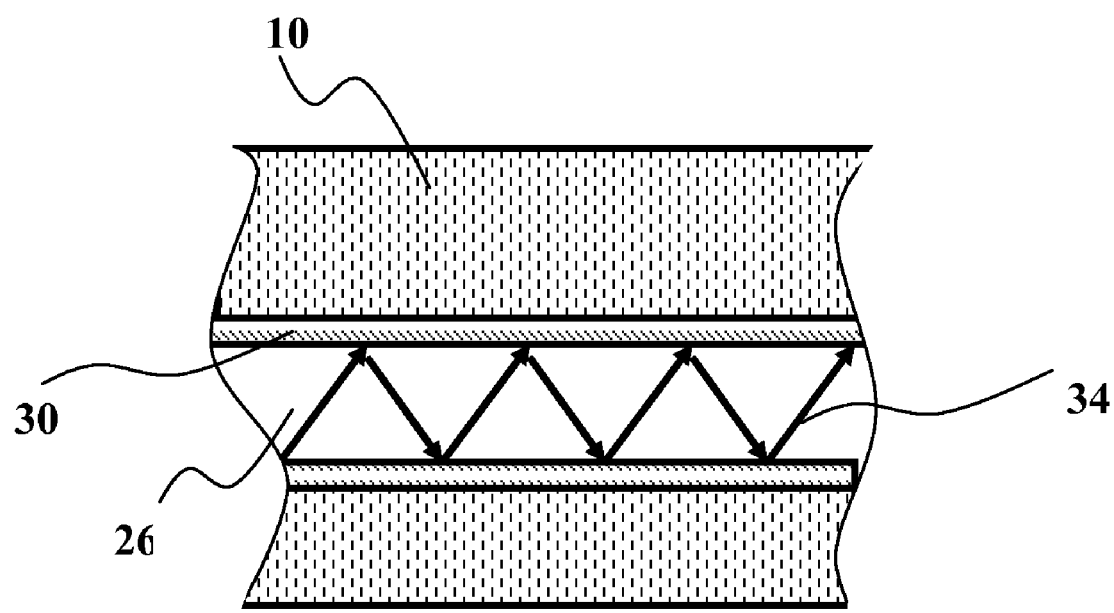
FIG. 2B is a side view of the portion of the device represented in FIG. 2A.

FIG. 2B is a side view of the portion of the device shown in FIG. 2A. A coating plane on which an reflective material 30 is painted is attached to the roof and floor of the tunnel 26 so that light 34 transmitted through the tunnel is transmitted in the desired direction by bouncing through the tunnel without reflecting backwards.

Figure 3A:
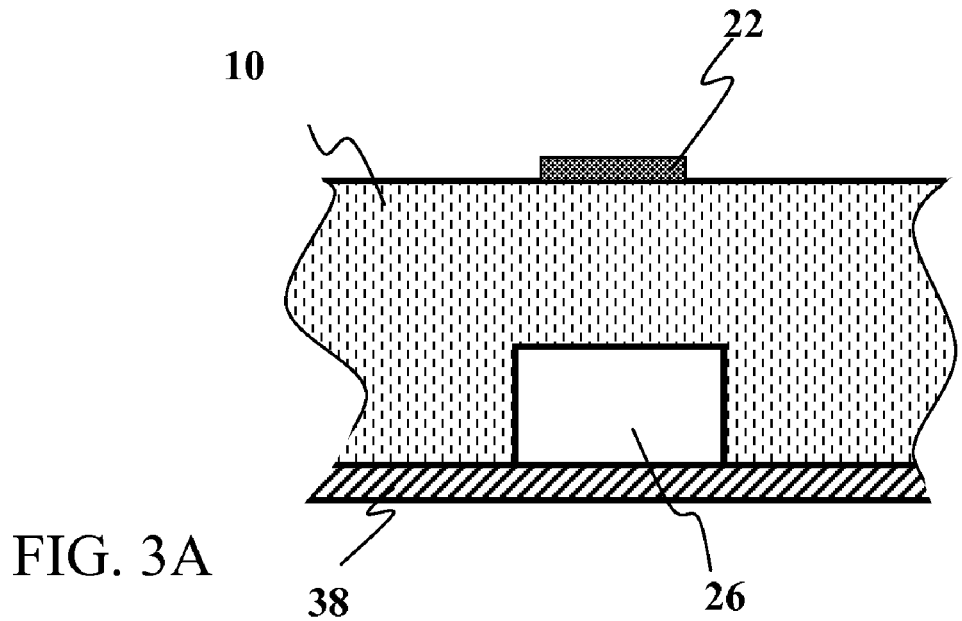
FIG. 3A is a cross-sectional view along BB' in FIG. 1. It consists of a substrate in which a tunnel is etched out on the backside of the substrate, and an electrical signal line on top of the substrate, aligned with the open tunnel.

FIG. 3A is a cross-sectional view along BB' in FIG. 1 according to the present invention. The electrical signal line 22 is attached to the substrate 10 on which there is a backside open tunnel 26. The substrate is attached to a ground plane 38 so that the electrical signal line and the ground plane form a microstrip type signal line. The electrical signal line is aligned with the open tunnel.

Figure 3B:
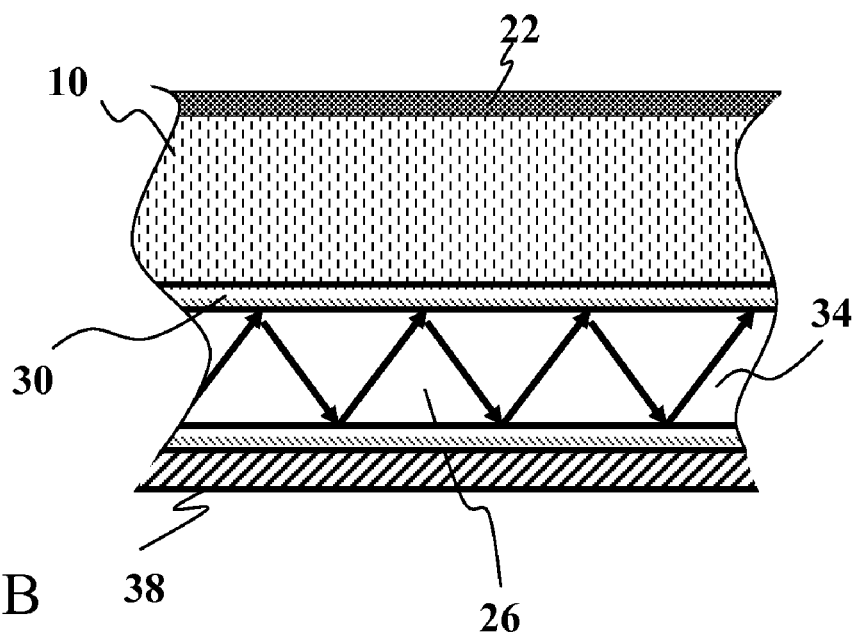
FIG. 3B is a side view of the portion of the device represented in FIG. 3B.

FIG. 3B is a side view of the portion of the device shown in FIG. 3A. A coating plane on which an reflective material 30 is painted is attached to the roof and floor of the tunnel 26 so that light signal 34 transmitted through the tunnel is transmitted in the same direction as the electrical signal line 22, by bouncing through the tunnel without reflecting backwards.

According to this invention, the effective dielectric loss (loss tangent) can be reduced and the electrical signal attenuation while propagating can be reduced. In other words, electrical signal transmission is less dispersive, and higher bandwidth of the interconnect is ascertained, as compared with the conventional PCB where signal conductor is laid onto the uniform dielectric medium. Less cross talk is also expected as the effective capacitance is also decreased. Based on the design, the significant of the electromagnetic wave can be made to pass through the open tunnel. As the optical signal 34 transmit through the open media (e.g. air), used to reduce the electrical signal dispersion, loss of optical signal is very minimal or none.

The width of the tunnel can be adjusted based on the electrical signal line width which is dependent on the desired electrical impedance and trench depth and width. The signal line impedance can be designed by designing the trench, substrate thickness, and the signal line width. According to this invention, the opened trenches can be filled with the air, fluid, or dielectric material (not shown) having lower dielectric loss than the substrate, and/or suitable for optical signal transparency.

Figure 4A:
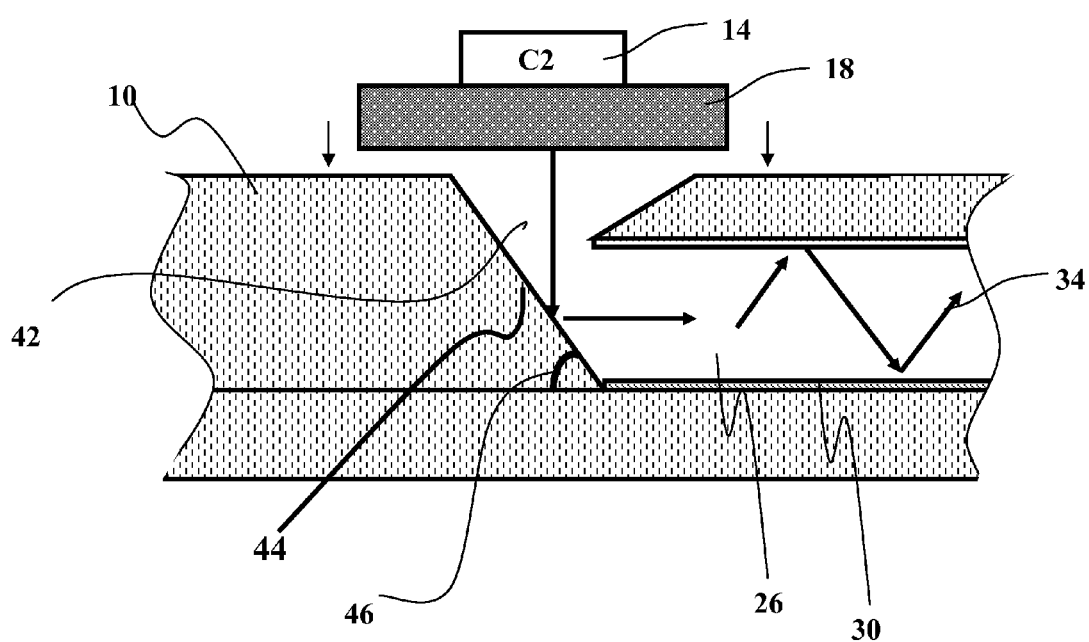
FIG. 4A is a side view of the transmitter side of the optical signal.

FIG. 4A is a side view of the transmitter side of the optical signal in accordance with the present invention, wherein like parts are indicated by like numerals as used in FIG. 1 to FIG. 3, so that similar explanation is omitted herewith. Transmitter side consists of an electronic element 14 on an optical-electrical board 18. The optical-electrical board is attached to the substrate 10 in a section with an opening 42. The substrate has an opening 42 through which light 34 emitted from the transmitter optical-electrical board is directed. The substrate has inclined surface 44 with an inclination angle theta 46 appropriate for directing the optical signal into the tunnel 26.

Figure 4B:
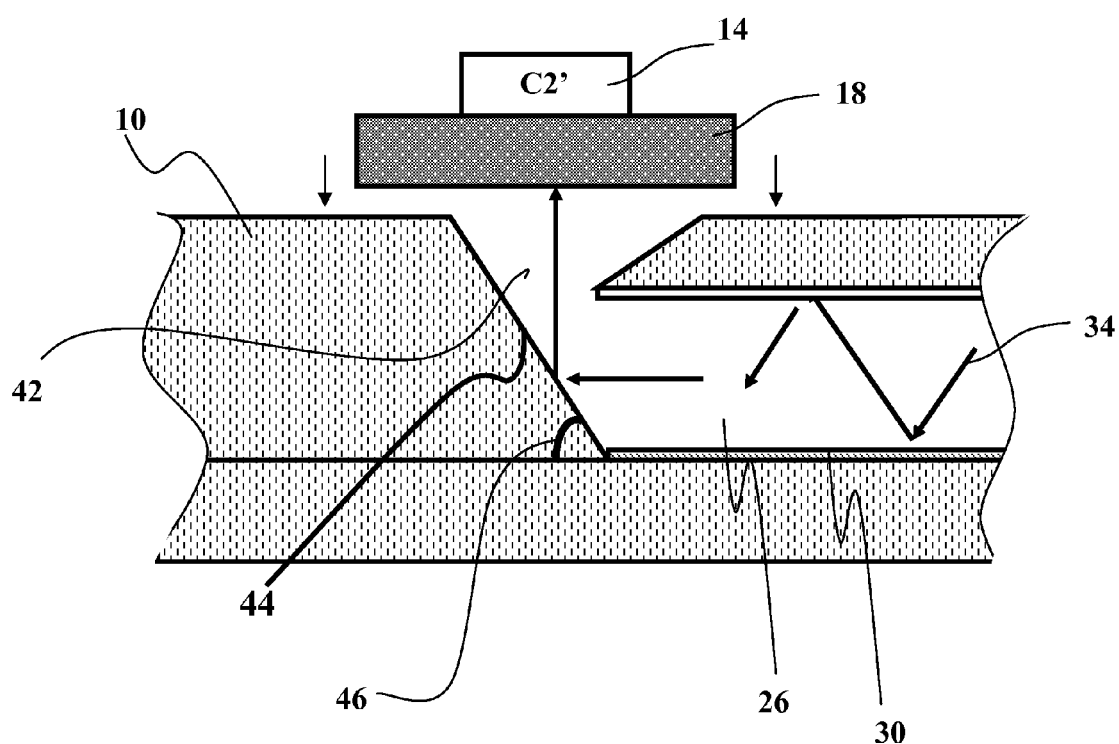
FIG. 4B is a side view of the receiver side of the optical signal.

FIG. 4B is a side view of the receiver side of the optical signal in accordance with the present invention wherein like parts are indicated by like numerals as used in FIG. 1 to FIG. 4A, so that similar explanation is omitted herewith. The difference between FIGS. 4A and 4B is that in FIG. 4B the light 34 is directed from the tunnel 26 to the receiver optical-electrical board 18.

Figure 5:
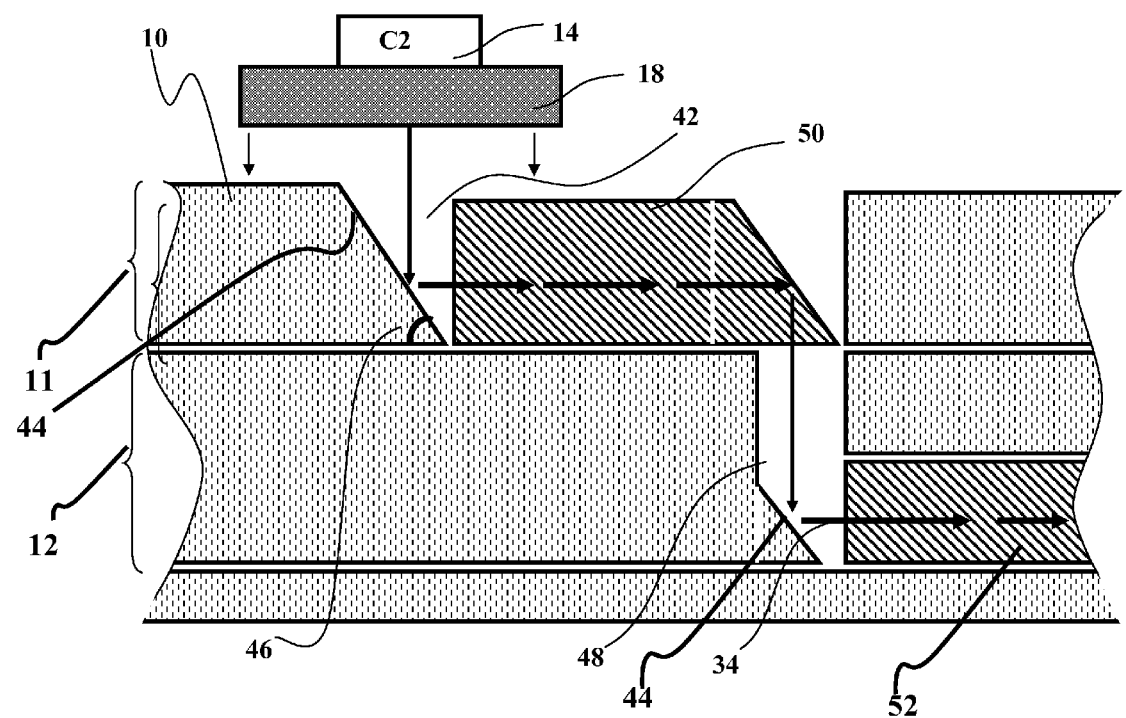
FIG. 5 is an embodiment of the optical signal in accordance with the present invention, wherein the optical signal can be routed to different layers of a multilayered board.

FIG. 5 is an embodiment of the optical tunnel in accordance with the present invention, wherein like parts are indicated by like numerals, so that similar explanation is omitted herewith. In FIG. 5 the ribbon fiber 50 is laid in an open tunnel 26 in the first layer 11 of the substrate 10. The second layer 11 of the substrate has an opening 42 or a vertical tunnel and a section of the substrate 44 is inclined at an appropriate angle 46 (e.g. 45 degrees), so that light 34 directed from the ribbon fiber 50 on the first tunnel is directed through the vertical tunnel 48 into another ribbon fiber 52 placed in another tunnel on the second layer 12 of the substrate. The result being that the optical signal 34 can be routed to different layers (e.g. 10 and 11) of a multilayered board, and in combination with an electrical signal, achieve a super high-speed interconnection data rate according to the present invention.

Further, in this embodiment, a waveguide can be inserted into the tunnel for the purpose of transmitting the optical signal from the electronic element 14 C2 and the transmitter optical-electrical board 18 to the receiving optical-electrical board and the C2' electronic element.

Figure 6A:
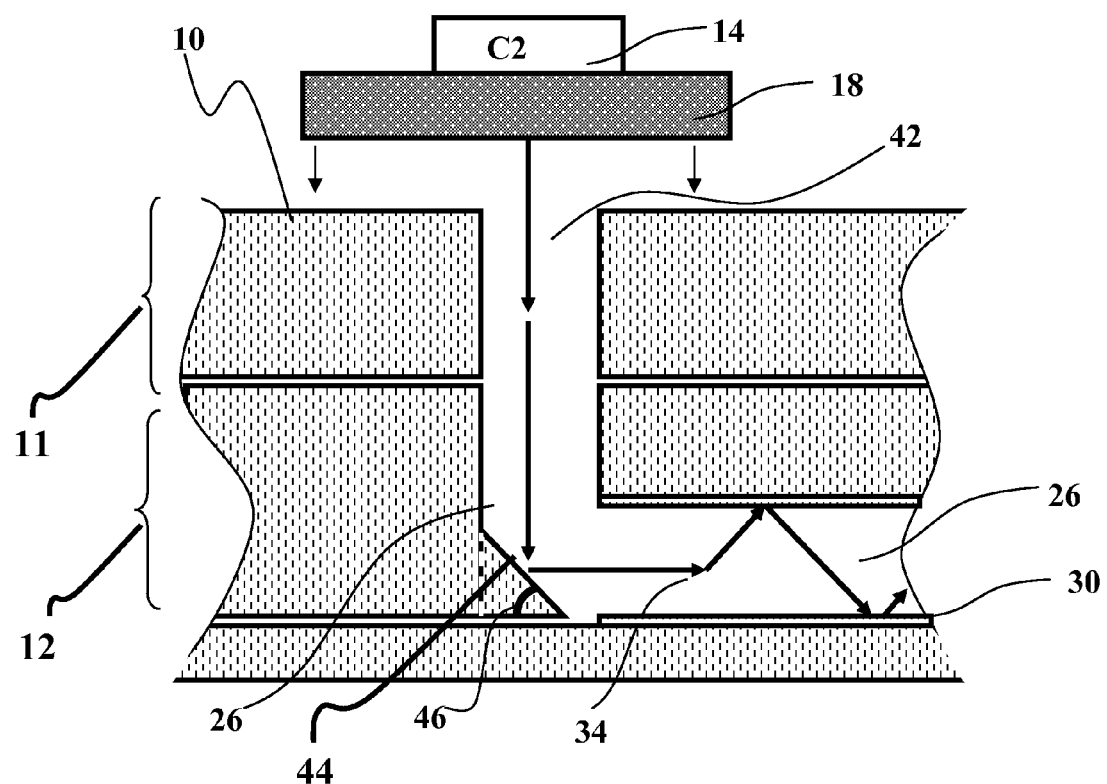
FIG. 6A is an embodiment of the optical signal in accordance with the present invention, wherein light is directed into a tunnel in the second layer of the substrate.

FIG. 6A is another embodiment of the optical tunnel in accordance with the present invention. wherein like parts are indicated by like numerals, so that similar explanation is omitted herewith There is an opening 42 and vertical tunnel 26 through the first layer 11 of the substrate 10 into the second layer 12 substrate. A section of the second layer 12 substrate is inclined at an angle 46 appropriate angle (e.g. 45 degrees) so that light 34 directed from the OE board 18 is directed through the vertical tunnel 42 into another tunnel 26 on the second layer 12 of the substrate. The result being that the optical signal 34 can be routed to different layers of a multi-layered board, and in combination with an electrical signal, achieve a super high-speed interconnection data rate according to the present invention.

Figure 6B:
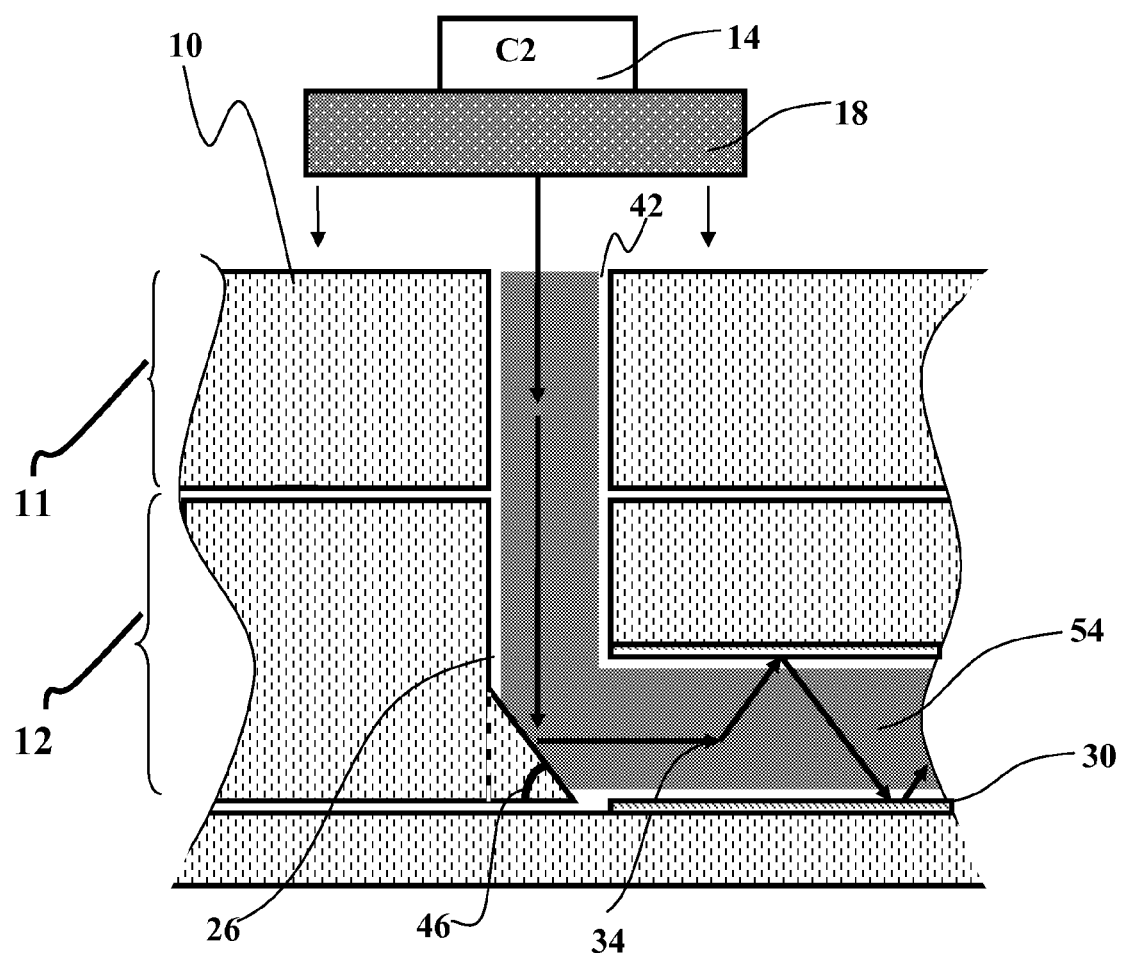
FIG. 6B is the same as the embodiment in FIG. 6A, except that the tunnel is filled with a material that can pass through light.

In FIG. 6B the tunnel 26 through the substrate layers 12 through which the optical signal is directed can be filled with a material 54 that can pass through light 34. The material can further alter the wavelength of light allowed to pass through the tunnel.

Figure 6C:
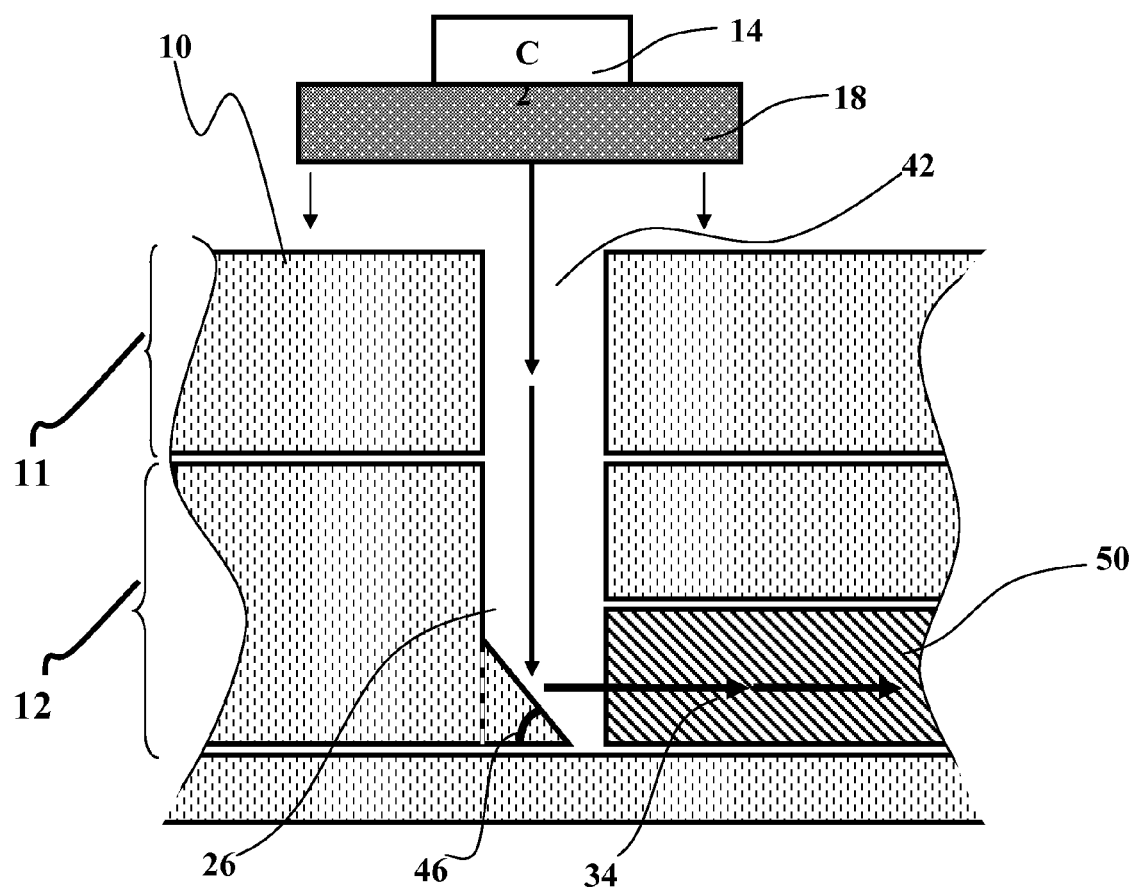
FIG. 6C is similar to FIGS. 6A and 6B, except that a ribbon fiber is inserted into the tunnel of a multilayered substrate so that light directed from the OE board is transmitted through the ribbon fiber to route the signal to another layer of the board.

FIG. 6C is another embodiment of the optical tunnel in accordance with the present invention, wherein like parts are indicated by the like numerals so that repeated explanation is omitted herewith. In this embodiment, a ribbon fiber 50 is inserted into the tunnel 26 of a multilayered substrate 10 so that light 34 directed from the OE board 18 is transmitted through the ribbon fiber to route the signal to another layer of the board. The combination of the high-speed data rate of the optical signal through the ribbon fiber and the electrical signal through the electrical signal line achieves the super high-speed interconnect data rate according to the present invention.

Further, a waveguide can be inserted into the tunnel for the purpose of transmitting the optical signal from the electronic element 14 C2 and the transmitter optical-electrical board to the receiving optical-electrical board and the C2' electronic element.

Figures 7A, 7B:
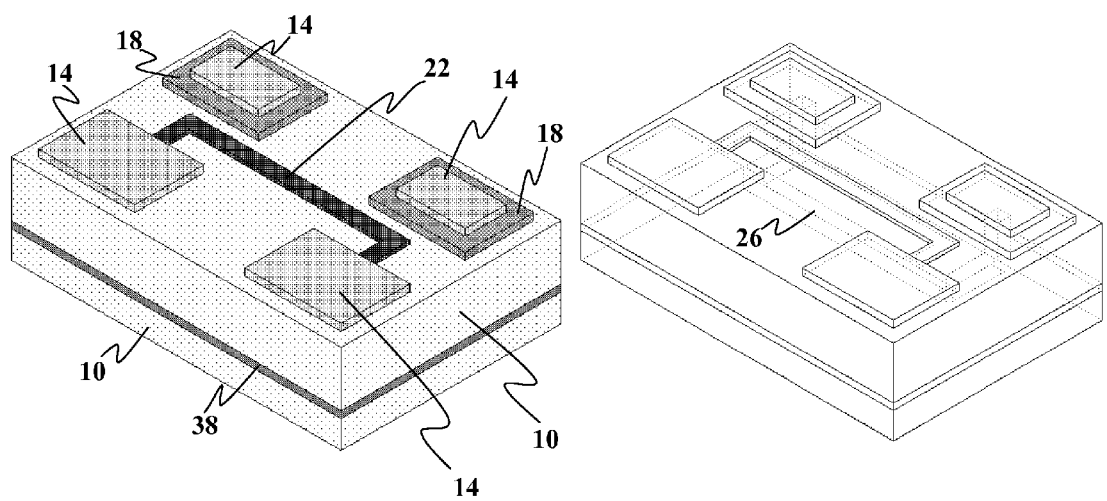
Figure 7C:
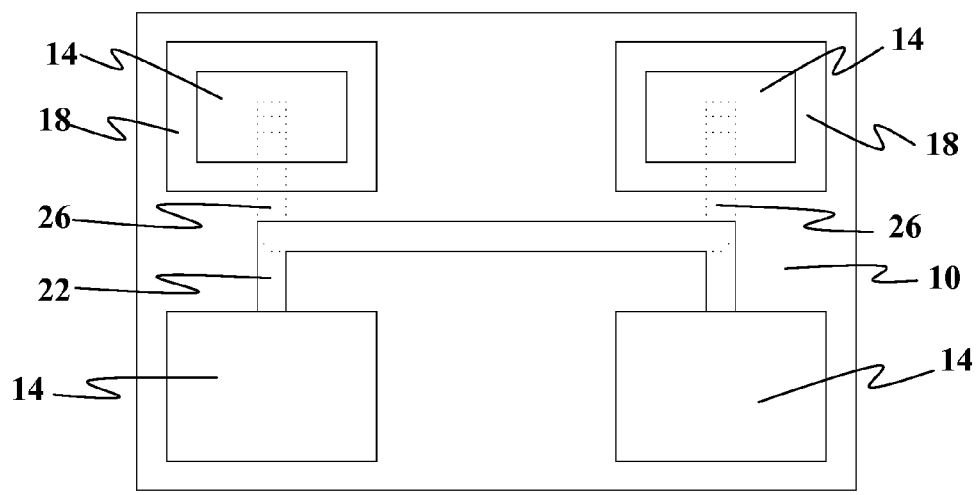
Figure 7D:
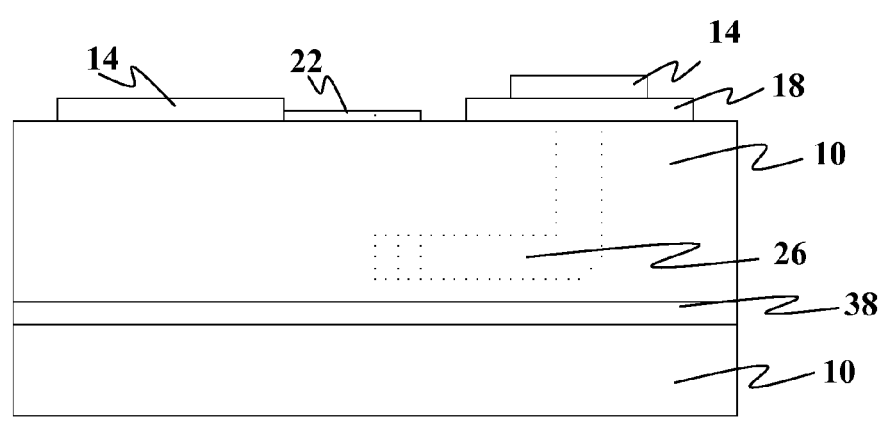

FIGS. 7A-7D are an embodiment of the invention having one electrical signal line 22 on the surface of the substrate 10 overlapping one optical tunnel 26 in the topmost layer of the substrate. The substrate is attached to a ground plane 38 so that the electrical signal line and the ground plane form a microstrip type signal line. FIG. 7A represents the invention as a hatched solid from a trimetric view, with like elements hatched with the same pattern for clarity. In this view, the optical tunnel is not visible because it extends through the interior of the substrate 10, and its openings are obscured from view by the electronic elements 14, which transmit and receive the high speed electrical signal, and the optical-electrical boards 18, which convert the electrical signals to optical signals for transmission through the optical tunnel and, upon receiving the optical signals, convert them back to electrical signals. FIG. 7B is identical to FIG. 7A, except that the hatching is removed and the hidden lines are represented as dotted lines, thus making the optical tunnel 26 in the interior of the substrate 10 visible. FIG. 7C represents the top view of the FIG. 7B, and the alignment of the electrical signal line 22 on the top of the substrate 10 over the optical tunnel 26 in the interior of the substrate is clearly visible. FIG. 7D represents the side view of FIG. 7B, demonstrating that the optical tunnel 26 extends through the interior of the substrate 10.

Figure 8A:
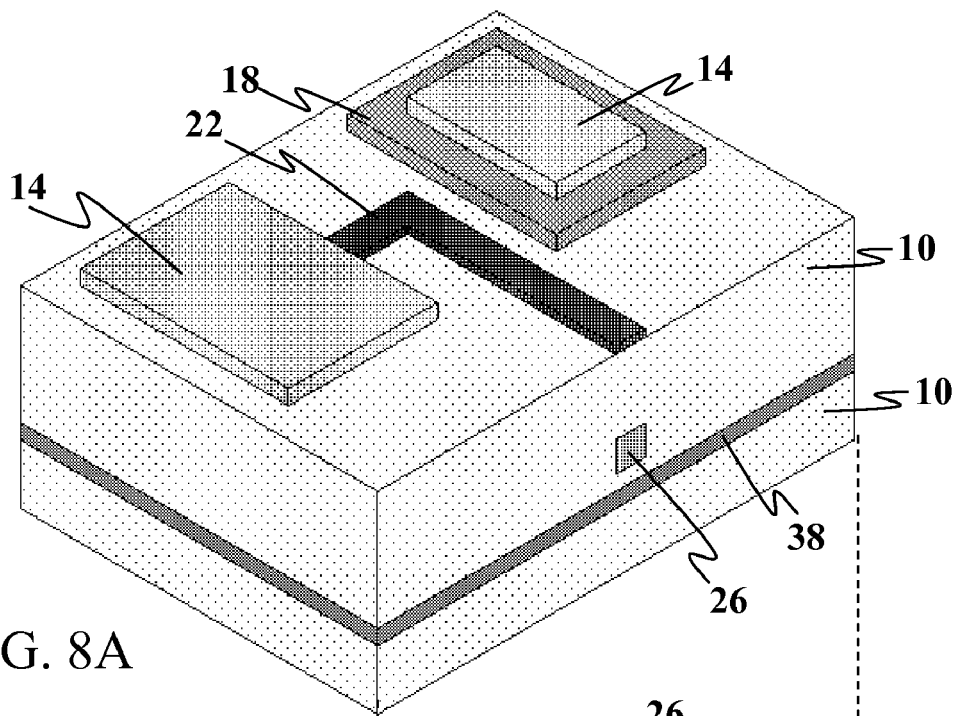
FIG. 8A is identical to FIG. 7A, except that half the device is cut away on a plane perpendicular to the electrical signal line and optical tunnel.
Figure 8B:
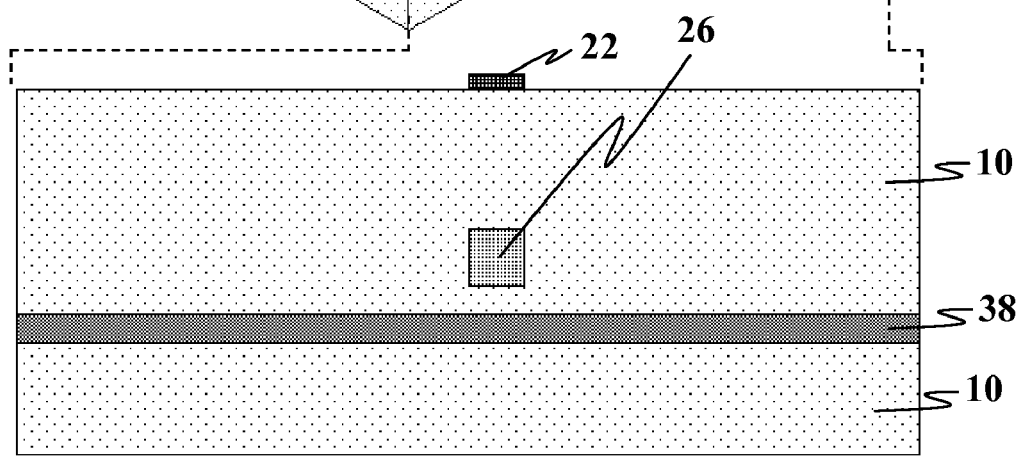
FIG. 8B is a cross section along the plane where the device is cut away in FIG. 8A.
Figure 9A:
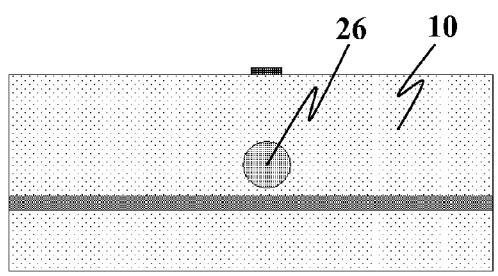
FIGS. 9A-9F represent cross sectional views of just some of the possible arrangements of the tunnel in the substrate.
Figure 9D:
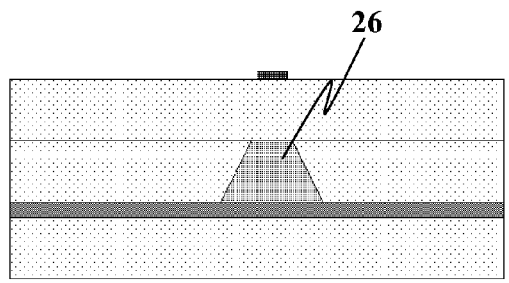
Figure 9B:
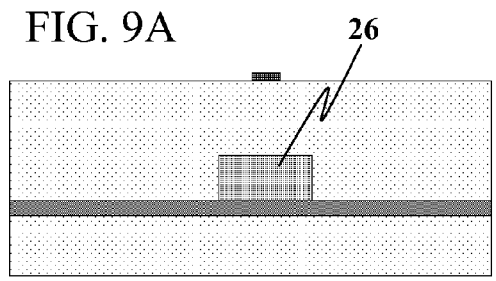
Figure 9E:
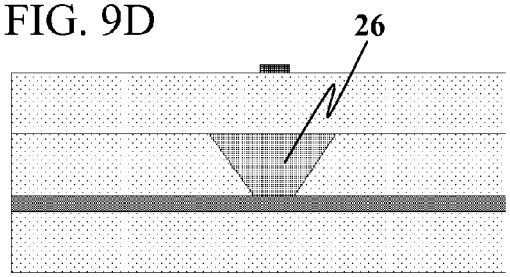
Figure 9C:
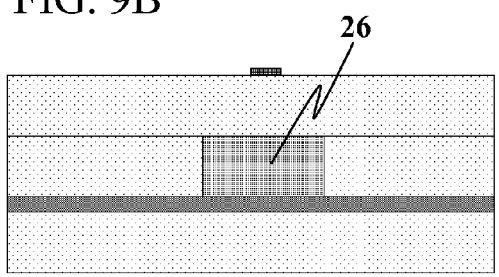
Figure 9F:
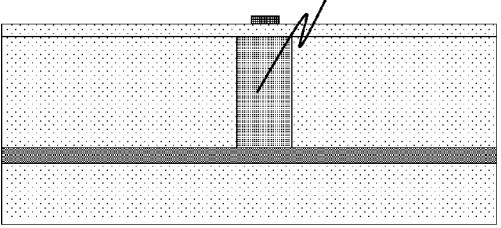

FIG. 8A is identical to FIG. 7A, except that half the device is cut away on a plane perpendicular to the electrical signal line 22 and optical tunnel 26. FIG. 8B is the cross section along that plane, showing the alignment of the electrical signal line 22 above the optical tunnel 26. Together, these figures show the arrangement of the electrical signal line 22, optical tunnel 26, and ground plane 38 in the substrate 10. In these figures from FIGS. 8A to 8B, the tunnel is shown filled with a material that is transparent to the light forming optical signal.

FIGS. 9A-9F represent some of the possible different cross sectional shapes of the optical tunnels 26, as well as different positioning in the substrate layer 10. Many variations, including variations of these shapes and positions are possible, without departing from the scope of the basic invention described herein.

Figures 10A, 10B:
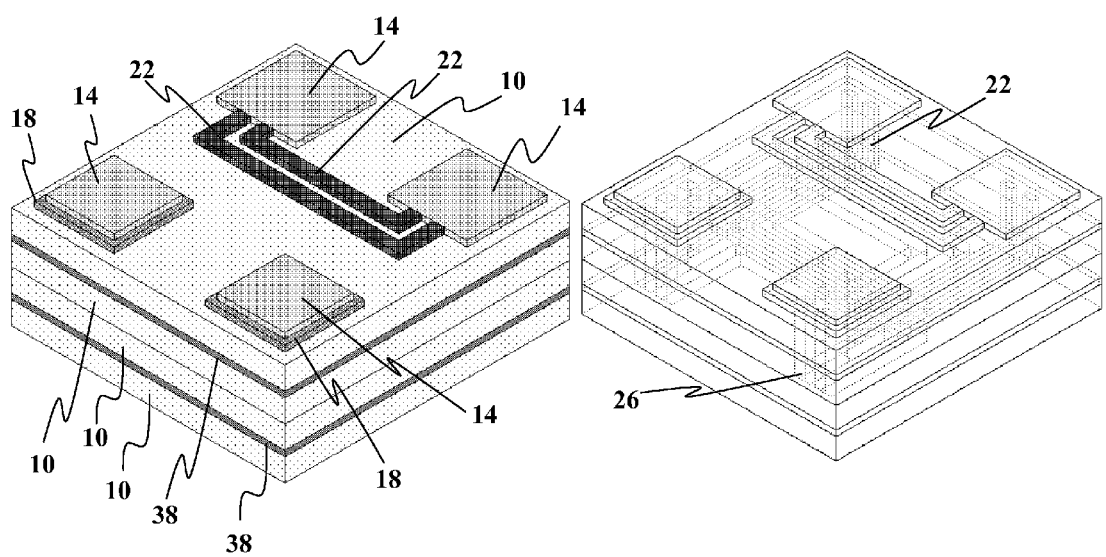
Figure 10C:
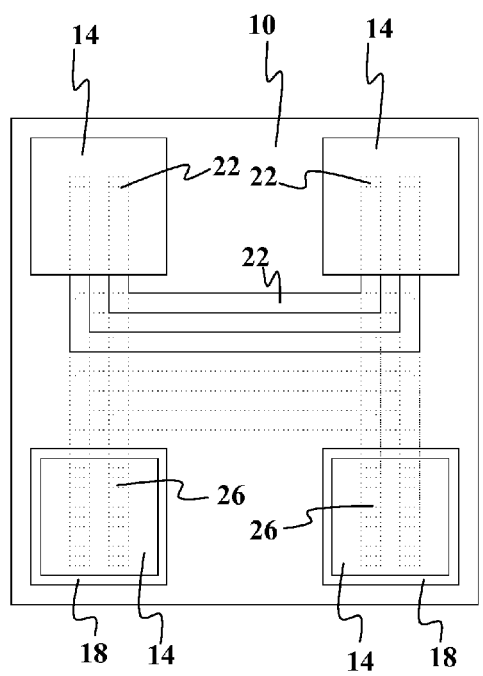
Figure 10D:
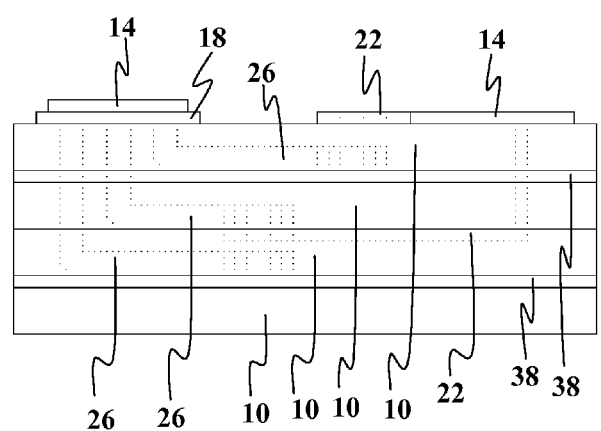

FIGS. 10A-10D represent an embodiment of the invention having two sets of electrical signal lines 22 connecting two of the electronic elements 14, which transmit and receive the high speed electrical signal, and three sets of optical tunnels 26 connecting the other two electronic elements 14 and the optical-electrical boards 18, which convert the electrical signals to optical signals for transmission through the optical tunnels and, upon receiving the optical signals, convert them back to electrical signals. The substrate 10 layers containing electrical signal lines are each attached to a ground plane 38 so that the electrical signal line and the ground plane form a microstrip type signal line. FIG. 10A represents the invention as a hatched solid from a trimetric view, with like elements hatched with the same pattern for clarity. Only the topmost set of electrical signal lines 22 are visible from this view, with the other set of electrical signal lines and the three sets of optical tunnels embedded in the layers of the substrate 10. FIG. 10B is identical to FIG. 10A, except that the hatching is removed and the hidden lines are represented as dotted lines, thus making the electrical signal lines 22 optical tunnels 26 in the interior of the substrate 10 visible. FIG. 10C represents the top view of FIG. 10B, and the overlapping alignment of the electrical signal lines 22 with the optical tunnels 26 is visible. FIG. 10D represents the side view of FIG. 10B, demonstrating that the optical tunnels 26 extend through the interior of the substrate 10 as well as one of the sets of electrical signal lines 22, which has a set of optical tunnels 26 aligned both above and below it.

FIGS. 11A-11D represent the same embodiment of the device in FIG. 10A-10D. In each figure, the device is separated in order to show how the embodiment is structured at a particular layer. Dotted lines are used to represent a component of the device that was contacting that layer before being separated.

Figure 11A:
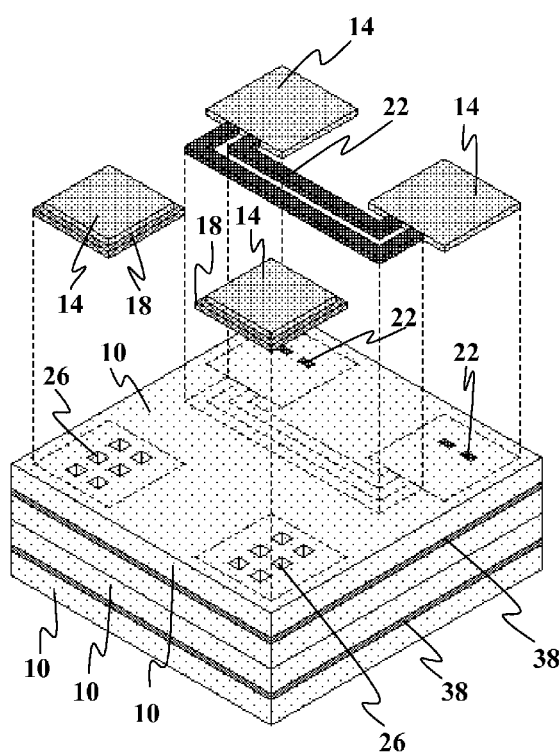
FIGS. 11A and 11B represent the same embodiment of the device in FIG. 10, with the electronic and optical elements lifted off the top of the substrate.
Figure 11B:
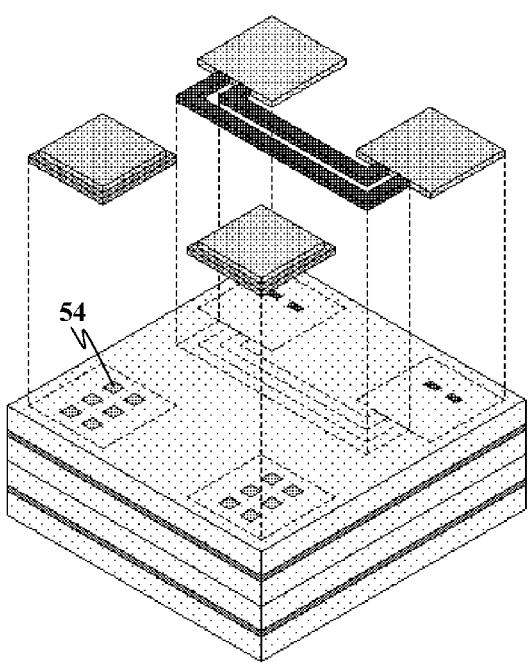

In FIGS. 11A and 11B, the elements of the device sitting on the top layer are lifted off to expose how the electrical signal lines 22 and optical tunnels 26 extend into the substrate 10. Three sets of two tunnels extend into the substrate under the optical-electrical boards 18, and one set of two electrical signal lines 22 extends into the substrate under two of the electronic elements 14. In FIG. 11A, the optical tunnels are not filled with any material, while in FIG. 11B, the optical tunnels 26 are filled with a material 54 that is transparent to the optical signal.

Figure 12A:
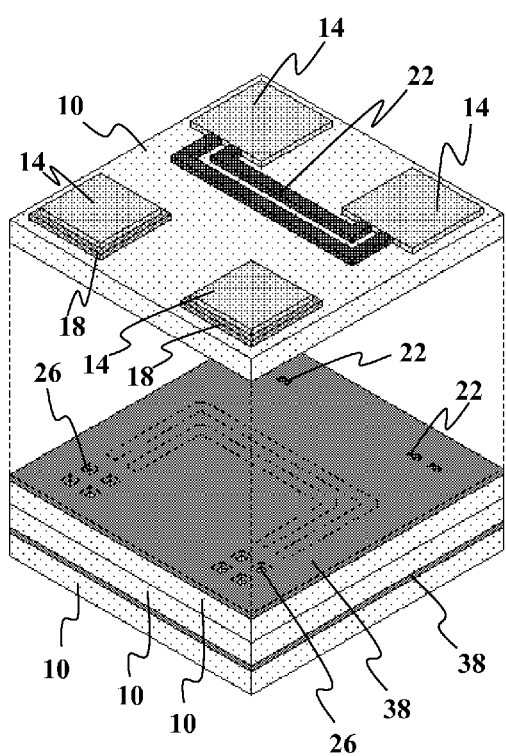
FIGS. 12A and 12B represent the same embodiment of the device in FIG. 10, with the device separated to show the interface between the first substrate layer and first ground plane.
Figure 12B:
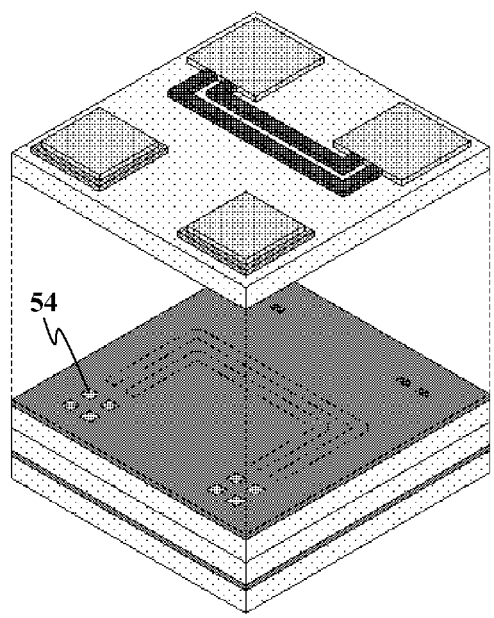

In FIGS. 12A and 12B, the top layer of the substrate 11 is lifted off to expose how the electrical signal lines 22 and optical tunnels 26 extend through the first ground plane 38. One set of electrical signal lines 22 and two sets of tunnels 26 extend through the ground plane, while the other set of tunnels is embedded in the first substrate layer just above the first ground plane. In FIG. 12A, the optical tunnels 26 are not filled with any material, while in FIG. 12B, the optical tunnels are filled with a material 54 that can pass through light.

Figure 13A:
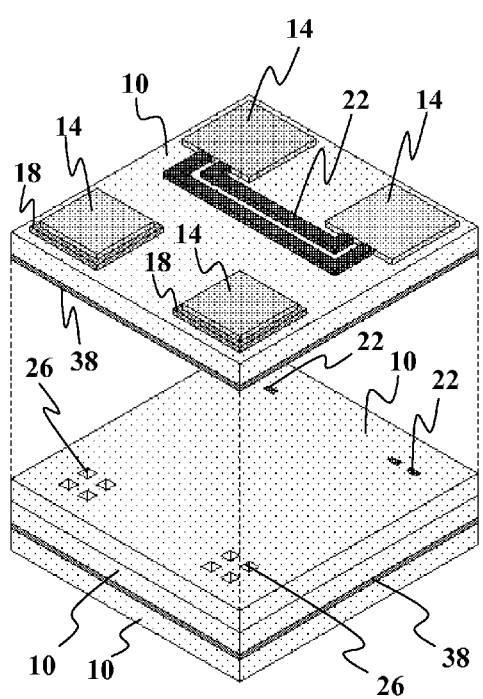
FIGS. 13A and 13B represent the same embodiment of the device in FIG. 10, with the device separated to show the interface between the first ground plane and second substrate layer.
Figure 13B:
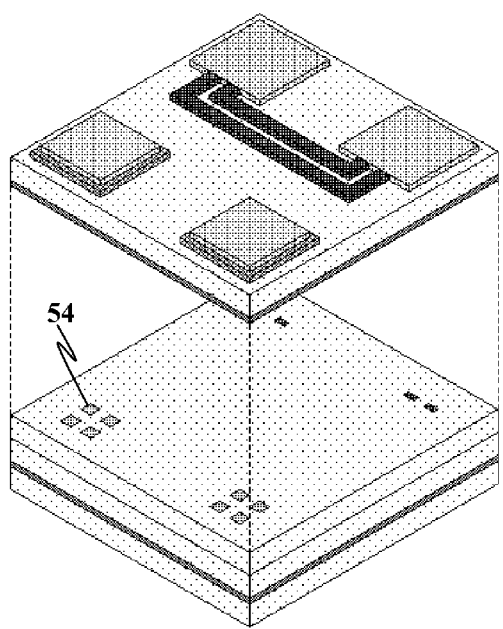

In FIGS. 13A and 13B, the first ground plane 38 is lifted off to show the orientation of the electrical signal lines 22 and optical tunnels 26 at the interface between the first ground plane and second substrate 10 layer. One set of electrical signal lines and two sets of tunnels extend into the second substrate layer, while the other set of tunnels is embedded in the first substrate layer just above the first ground plane. In FIG. 13A, the optical tunnels are not filled with any material, while in FIG. 13B, the optical tunnels are filled with a material 54 that can pass through light.

Figure 14A:
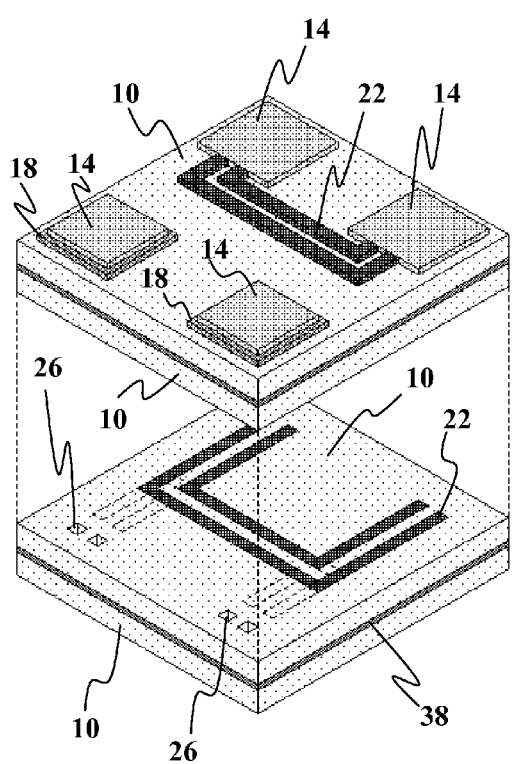
FIGS. 14A and 14B represent the same embodiment of the device in FIG. 10, with the device separated to show the interface between the second and third substrate layers.
Figure 14B:
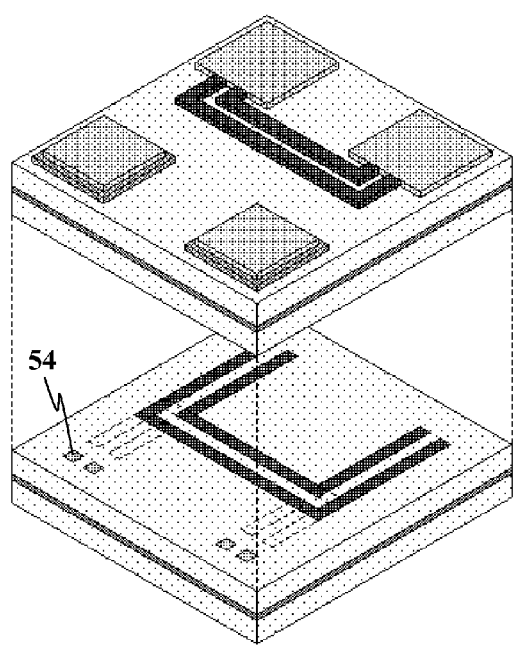

In FIGS. 14A and 14B, the second substrate 10 layer is lifted off to show the orientation of the electrical signal lines 22 and optical tunnels 26 at the interface between the second and third substrate layers. One set of electrical signal lines can be seen embedded in the third substrate layer, at the top of that layer; dotted lines represent one set of tunnels that is embedded in the second substrate layer, at the bottom of that layer; and another set of tunnels extends into the third substrate layer. In FIG. 14A, the optical tunnels are not filled with any material, while in FIG. 14B, the optical tunnels are filled with a material 54 that can pass through light.

Figure 15:
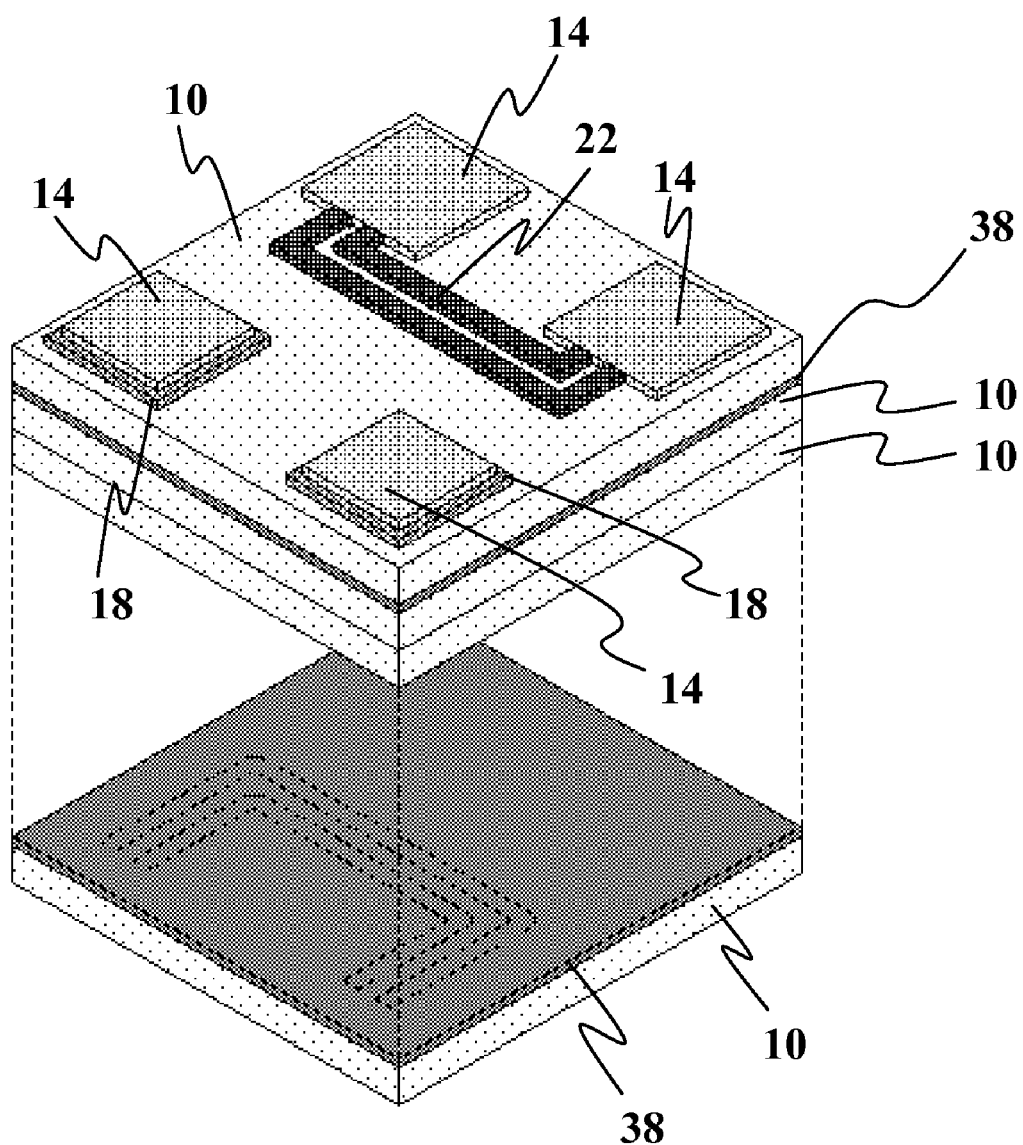
FIG. 15 represents the same embodiment of the device in FIG. 10, with the device separated at the interface between the third substrate layer and second ground plane.

In FIG. 15, the third substrate 10 layer is lifted off to show the orientation of the optical tunnels 26 at the interface between the third substrate layer and second ground plane 38. Dotted lines represent one set of tunnels that is embedded in the third substrate layer, at the bottom of that layer.

Figure 16A:
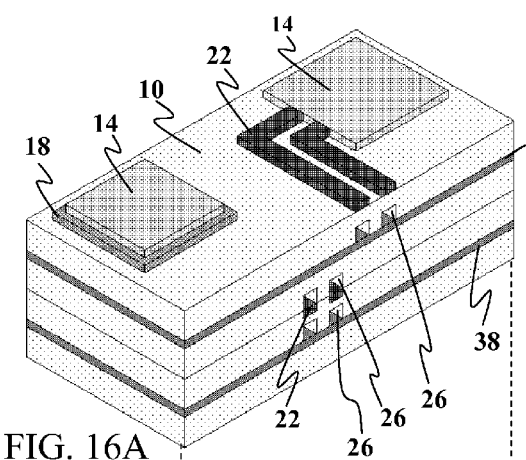
FIG. 16A is identical to FIG. 10A, except that half the device is cut away on a plane perpendicular to the electrical signal lines and optical tunnels. In this figure, the tunnels are open to air.
Figure 16C:
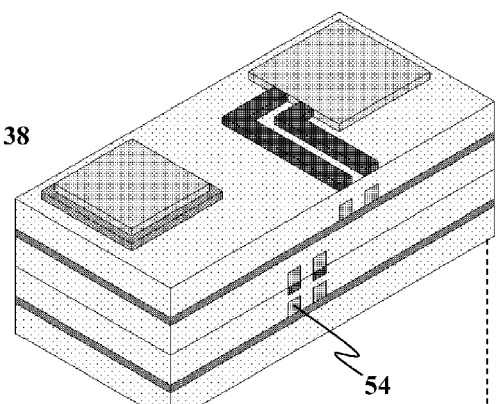
FIG. 16C is identical to FIG. 16A, except that the tunnels are filled with a material that can pass through light.
Figure 16B:
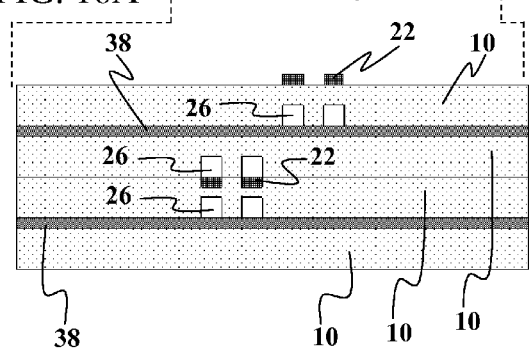
FIG. 16B is a cross section along the plane where the device is cut away in FIG. 16A.
Figure 16D:
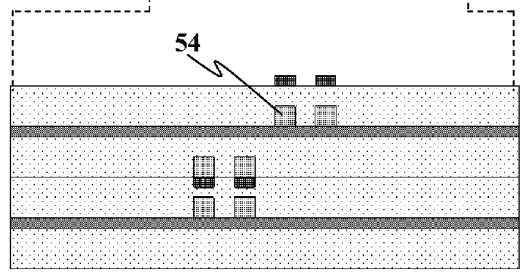
FIG. 16D is a cross section along the plane where the device is cut away in FIG. 16C, and is identical to FIG. 16B except that the tunnels are filled with a material that can pass through light.

FIGS. 16A-16D represent alternative embodiment of the invention according to this invention, wherein the same parts are represented by same numerals so that repeated explanations are omitted herewith. FIG. 16A is identical to FIG. 10A, except that half the device is cut away on a plane perpendicular to the electrical signal lines 22 and optical tunnels 26. FIG. 16B is the cross section along that plane. FIG. 16C is identical to FIG. 16A, and FIG. 16D is identical to FIG. 16B, except that in FIGS. 16A and 16B the tunnels are not filled with any material, while in FIGS. 16C and 16D they are filled with a material 54 that can pass through light. Together, these figures show the arrangement of the electrical signal lines and optical tunnels in the different layers of the substrate 10. In this embodiment the two sets of electrical signal lines 22 and their corresponding optical tunnels 26 are staggered in their arrangement for greater structural stability.

FIGS. 17A-17D correspond to FIGS. 16A-16D, except that the device is cut away on a different plane, one that extends through the electronic elements 14 and optical-electrical boards 18. This view demonstrates how the tunnels 26 and electrical signal lines 22 extend into the substrate 10 from under the electronic elements and optical-electrical boards.

Figure 18A:
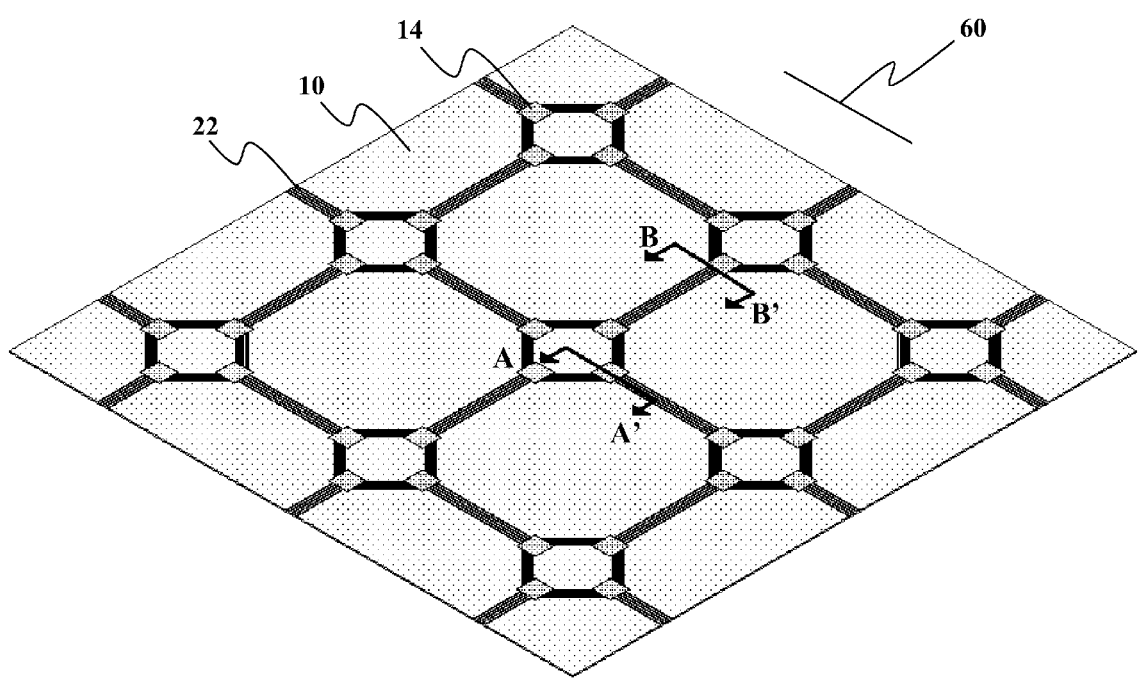
FIG. 18A shows an array of chips interconnected according to the present invention.
Figure 18B:
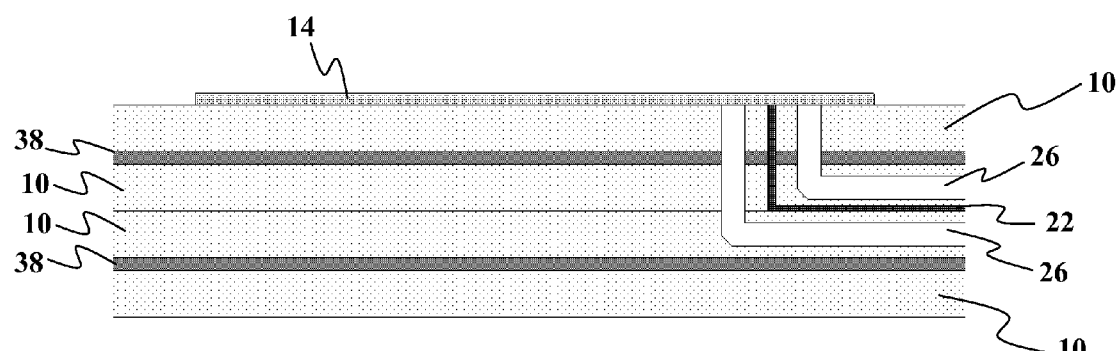
FIG. 18B shows a cross-sectional view along the line AA' in FIG. 18A.
Figure 18C:
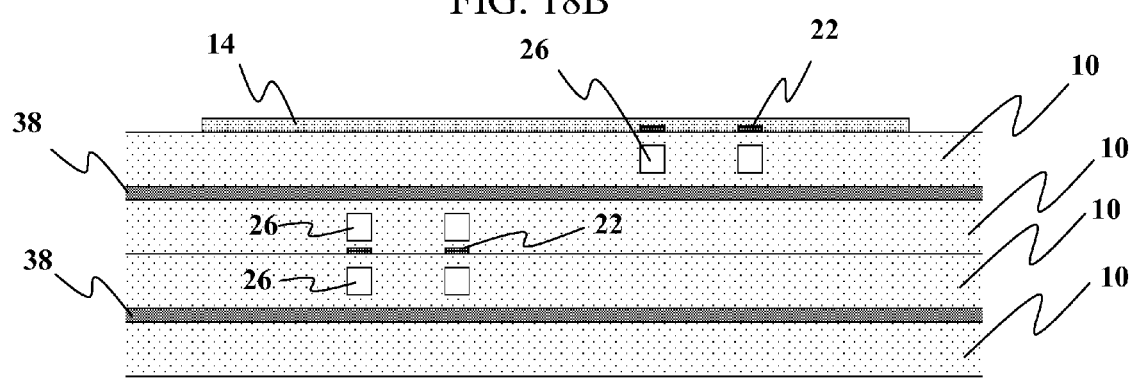
FIG. 18C is a cross-sectional view along the line BB' in FIG. 18A.

FIG. 18A represents an array 60 of electronic elements 14 interconnected according to the present invention. This view represents the application of the present invention to off-chip applications, where the chips are interconnecting by both an optical interconnection (not shown) and an electrical interconnection 22 on a substrate 10. FIG. 18B represents the cross-sectional view along the line AA' in FIG. 18A, where the optical tunnels 26 are now visible, aligned with the electrical signal lines 22 inside the substrate 10. FIG. 18C represents the cross-sectional view along the line AA' in FIG. 18C, where the alignment of the optical tunnels 26 inside the substrate 10 with the electrical signal lines 22 is visible.

According to the invention, based on the super high-speed interconnect structure design, the effective dielectric loss and effective dielectric constant of the interconnect system can be controlled. This helps to add many features in the interconnection such as varying the phase velocity (which is a function of the dielectric constant), varying the bandwidth of the interconnect, helping to adjust the skews of the signal etc. in the single interconnect system. According to the preferred embodiment, ideally, the speed of the signal in the signal line can be made to the speed of light in the air, if other losses due to the signal line structure such as the electrode parameter (resistance, capacitance) are neglected. It can be possible to make the bandwidth of the electronic interconnect system closer or greater than optical fiber (closer to the light). In the example, the super high-speed interconnection board consisting of the opened (backside)-tunnel or backside trench or slot in which optical signal and electrical signal are combined is considered. This invention covers all super high-speed off-chip and on-chips interconnects, in which embedded signal lines as mentioned earlier are used.

According to this invention, the super high speed off-chip and on-chip interconnects can be designed using a single or a plurality of substrates or dielectric layer(s) with backside opened tunnel, trench, or slot under the high-speed signal line and with the tunnel transmitting an optical signal. For simplicity, we have specific embodiments; however, this present invention also includes all super high speed PCB and also on-chip (inside IC) having single or multiple layered metal signal lines having a tunnel, trench, or slot under a electrical signal line and a tunnel, trench or slot transmitting an optical signal to increase the combined bandwidth of the interconnection system.

According to this invention, it is our objective to provide the super high speed off-chip or on-chip interconnect systems connecting two or more electronic elements by the interconnects wherein the air-gaps are used in between the electrical signal lines wherein air-gaps will transmit the optical signal.

According to the present invention, it is our objective to control the propagation of the optical or light signal significantly inside the tunnel, trench, or slot by filling with the fluid, coolant, or material that allows light to pass through at different wavelengths, which thereby increases the bandwidth of the interconnection system and reduces the signal propagation delay. In addition, it is our objective to control the propagation of the optical or light signal by selecting light of different wavelengths to be transmitted through the tunnel, trench, or slot to achieve variable super high-speed interconnection.

In the preferred embodiments, the substrate or dielectric layer is mentioned in an effort to cover all dielectric materials which show dielectric properties. The dielectric materials include all kinds of ceramic materials such as Duroid, AlN, $Al_2O_3$, Mullite ($3Al_2O_3$: $2SiO_2$), SiC, $SiO_2$, Silicon nitride, silicon carbide, Silicon-Oxy-Nitride, BeO, Cordie-rite (magnesium alumina silicate), BN, Glass (with different compositions), polyimide, epoxy-glass, FR4, CaO, MnO, $ZrO_2$, PbO, alkali-halide (e.g. NaBr, NaCl) etc.) BN, BeO, and all kinds of low temperature cofired ceramics etc., and all kinds of the polyimides and benzocyclobutenes (BCBs) having dielectric properties. All kinds of polymer materials having dielectric properties also fall under this dielectric material. These dielectric materials can be made using high temperature ceramics processing or using the IC fabrication process. Polymer dielectric material also includes, but is not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. Dielectric materials, which can be made using high temperature ceramics processing or using the IC fabrication process, are also included in this category. All standard polymers can be available from the standard manufacturer for example, Du-pont, Hitachi-Chemical, Mitsui, and Mitsubishi-Chemical Industries. Gore-Tex, Japan, markets liquid crystal polymer.

According to this invention, the semiconductor substrates such as silicon, germanium, GaAs, InP, etc. can be used as the substrate for on-chip interconnects wherein the metal interconnects are used for carrying the electrical signals and they are located on several layers and each layer is made of dielectric layer. The trench or air-gaps underneath the signal lines or in between two signal lines carry the optical signals. The metal signal lines connects two or more electronics elements made in the substrate.

Several preferred embodiments for super high-speed on-chip and off-chips interconnects are described considering the microstrip line configuration and also the substrate with backside tunnel, trench, or slot. All signal line configurations as mentioned earlier are covered under this invention. The shape of the tunnel could be any type such as square, rectangular, circular, trapezoidal or any polygonal shape, or any shape suitable for manufacturing. These can be filled up by dielectric material having a lower dielectric constant than the dielectric substrate, coolant, or materials allowing light to pass through at different wavelengths.

The present invention is expected to find practical use in the super high-speed on-chip, off-chip interconnects, where signal speeds of 10 Gb/s per line and beyond are necessary using conventional materials, and the bandwidth of the interconnects can be made ideally to speed of the light for no-loss transmission line. The present invention can also be implemented in the super high-speed single or multiple signal connectors, and high-speed cables (not shown). The applications include on-chip interconnects where high-speed electronics chips or electronics chips with optical chips need to be connected. As ideally the bandwidth of the interconnect system can be made to be close to or to exceed fiber, future monolithic (and also hybrid near future) integration of electronics and optical chips can also be interconnected without (much or none at all) sacrifice of the chips speed. The application also includes super high speed multichip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The application also includes the high speed (20 Gb/s and beyond) connectors and cables for super high speed board-to-board, rack-to-rack interconnection, and also single or multiple high-density signal connections and carrying from one side to the other in longer path.

Although the invention has been described with respect to specific embodiments for complete and clear disclosure, the appended claims are not to be thus limited but are to be construed as embodying all modifications and alternative constructions that may occur to one skilled in the art that fairly fall within the basic teaching heretofore set forth.

Furthermore, the use of the indefinite article "a" or "an" in the following open-ended claims is not to be construed in the limiting sense, but is to be given its natural interpretation of "one or more." Additionally, the word "tunnel" in the following claims is to be interpreted broadly as encompassing any type of tunnel, trench, or slot, or any other structure similar in form and function that may be found in the substrate.

What is claimed is:

1. A high speed interconnect system comprising:
   an electrical interconnect comprising:
      a first substrate;
      a first electrical signal line overlying said first substrate;
      a first tunnel embedded in said first substrate under said first electrical signal line, said first tunnel following the pathway of said first electrical signal line; and
      a first ground plane attached to said first substrate; and
   an optical interconnect comprising:
      said first tunnel.

2. The interconnect system of claim 1, further comprising:
   a set of electronic elements, wherein said electrical interconnect provides an electrical connection between said set of electronic elements; and
   a set of optical-electrical elements, wherein said optical interconnect provides an optical connection between said set of optical-electrical elements.

3. The interconnect system of claim 2, wherein said set of optical-electrical elements are connected to another set of electronic elements.

4. The interconnect system of claim 1, wherein said first ground plane is underlying said first substrate.

5. The interconnect system of claim 4, said electrical interconnect further comprising:
   a second substrate overlying said first substrate;
   a second tunnel embedded in said second substrate over said first electrical signal line, said second tunnel following the pathway of said first electrical signal line; and
   a second ground plane overlying said second substrate, wherein said optical interconnect further comprises:
      said second tunnel.

6. The interconnect system of claim 1, wherein said first tunnel is filled with a material that is transparent to an optical signal and has a lower dielectric constant than said first substrate.

7. The interconnect system of claim 1, wherein said first tunnel is filled with a material that alters the wavelength of light transmitted through the first tunnel and has a lower dielectric constant than said first substrate.

8. The interconnect system of claim 1, wherein said first tunnel has a reflective coating.

9. The interconnect system of claim 1, further comprising a ribbon fiber inside said first tunnel.

10. The interconnect system of claim 1, said electrical interconnect further comprising:
    a second ground plane attached to said first substrate, said first ground plane and said second ground plane overlying said first substrate on opposite sides of said first electrical signal line.

11. The interconnect system of claim 10, said electrical interconnect further comprising:
    a third ground plane underlying said first substrate.

12. The interconnect system of claim 1, wherein said first tunnel is filled with air.

13. A high speed interconnect system comprising:
    a dielectric substrate;
    an electrical signal line overlying said dielectric substrate;
    a ground plane underlying said dielectric substrate;

and a tunnel embedded in and running through said dielectric substrate under said electrical signal line, said tunnel following the pathway of said electrical signal line,
wherein said tunnel provides an optical signal connection between at least two optical-electrical elements;
and said electrical signal line provides an electrical signal connection between at least two electronic elements.

14. The interconnect system of claim 13, wherein said tunnel is filled with a material that is transparent to an optical signal and has a lower dielectric constant than said dielectric substrate.

15. The interconnect system of claim 13, wherein said tunnel is coated with a reflective coating.

16. The interconnect system of claim 13, wherein said tunnel is filled with air.

17. The interconnect system of claim 13, wherein said tunnel is filled with a material that alters the wavelength of light transmitted through the tunnel and has a lower dielectric constant than said dielectric substrate.

18. The interconnect system of claim 13, further comprising a ribbon fiber inside said tunnel.

19. A high speed interconnect comprising:
a first dielectric layer;
a first tunnel running through said first dielectric layer suitable for transmission of an optical signal;
a first electrical signal line overlying said first dielectric layer and aligned with said first tunnel;
a first ground plane attached to said first dielectric layer,
wherein said first electrical signal line connects at least two electronic elements,
and wherein said first tunnel connects at least two optical-electrical boards;
a second dielectric layer attached to said first dielectric layer;
a second electrical signal line overlying said second dielectric layer;
a second tunnel running through said second dielectric layer;
and a second ground plane attached to said second dielectric layer,
wherein said second tunnel is aligned with said second electrical signal line and has lower dielectric loss than said second dielectric layer.

20. The interconnect of claim 19, wherein said first dielectric layer overlies said second dielectric layer, such that said first electrical signal line and said first ground plane form a microstrip type signal line; and said first ground plane, said second electrical signal line, and said second ground plane form a stripline type signal line.

* * * * *